United States Patent
Kiaie et al.

(10) Patent No.: US 7,435,046 B2
(45) Date of Patent: Oct. 14, 2008

(54) DYNAMIC CAROUSEL ROBOTIC WORKCELL

(75) Inventors: Jubin Kiaie, Novato, CA (US); Alex Dadiomov, Lafayette, CA (US)

(73) Assignee: Aries Innovations, Santa Clara, CA (US)

( * ) Notice: Subject to any disclaimer, the term of this patent is extended or adjusted under 35 U.S.C. 154(b) by 142 days.

(21) Appl. No.: 11/136,958

(22) Filed: May 24, 2005

(65) Prior Publication Data
US 2006/0269384 A1    Nov. 30, 2006

(51) Int. Cl.
*B65H 1/00* (2006.01)
(52) U.S. Cl. .................. 414/223.01; 414/331.05; 700/213; 700/245; 901/7
(58) Field of Classification Search ........... 414/223.01, 414/331.05; 700/213, 245; 324/158.1
See application file for complete search history.

(56) References Cited

U.S. PATENT DOCUMENTS

| | | | | |
|---|---|---|---|---|
| 4,722,653 A | * | 2/1988 | Williams et al. | 414/222.13 |
| 5,222,285 A | * | 6/1993 | Horikawa | 29/33 P |
| 6,646,436 B2 | * | 11/2003 | Mihara et al. | 324/212 |
| 6,967,475 B2 | * | 11/2005 | Tsui et al. | 324/158.1 |

OTHER PUBLICATIONS

Phase Metrics, Inc., "Distributed Automation—Replacing Rigid Product Flow With Unmatched Flexibility", "DA System", 1999.

* cited by examiner

*Primary Examiner*—Donald Underwood
(74) *Attorney, Agent, or Firm*—Vierra Magen Marcus & DeNiro LLP

(57) ABSTRACT

A dynamic workcell includes a three dimensional positioning robot positioned adjacent a plurality of operation stations. A plurality of movable part fixtures located adjacent to the robot is also provided. A fixture location controller directing positioning of the part fixtures relative to the plurality of operation stations to minimize travel between an operation station and a part fixture is provided. A method for operating a workcell may include the steps of: mapping ones of a plurality of testers to the plurality of movable part fixtures; maintaining the position of each movable part fixture; determining a current location of an active part fixture relative to a mapped tester; and minimizing the distance between the mapped tester and the active part fixture.

10 Claims, 10 Drawing Sheets

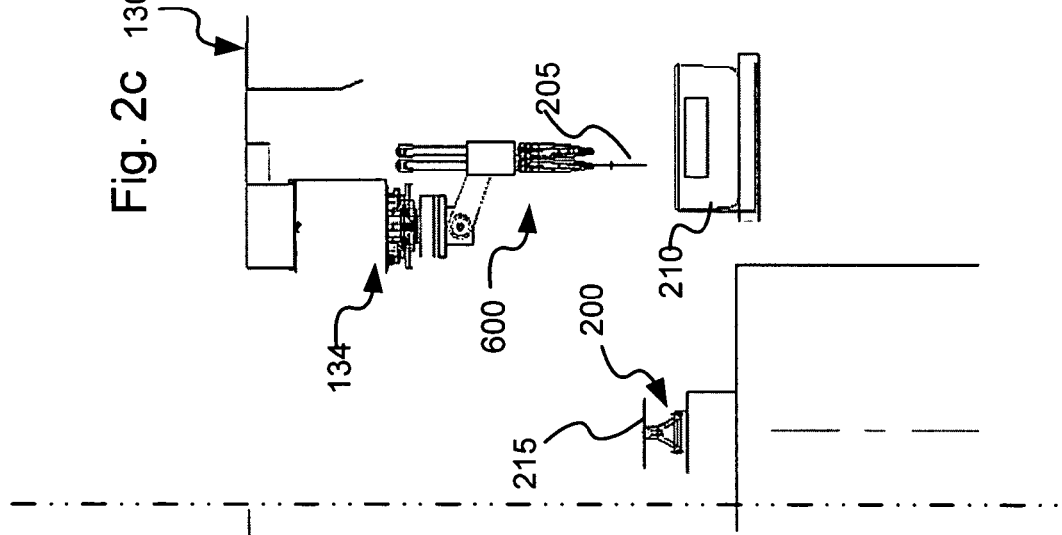
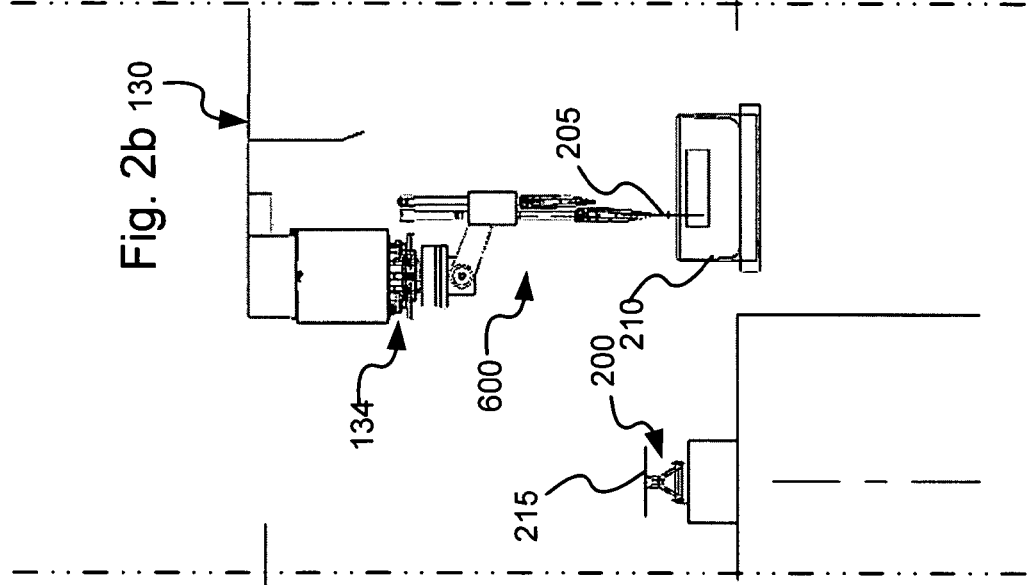
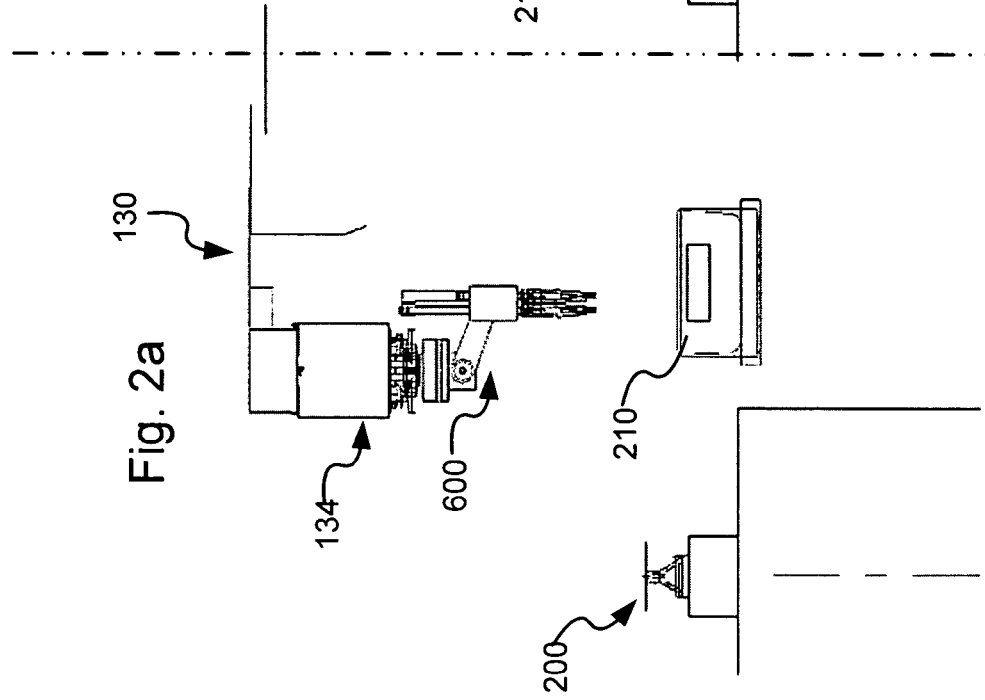

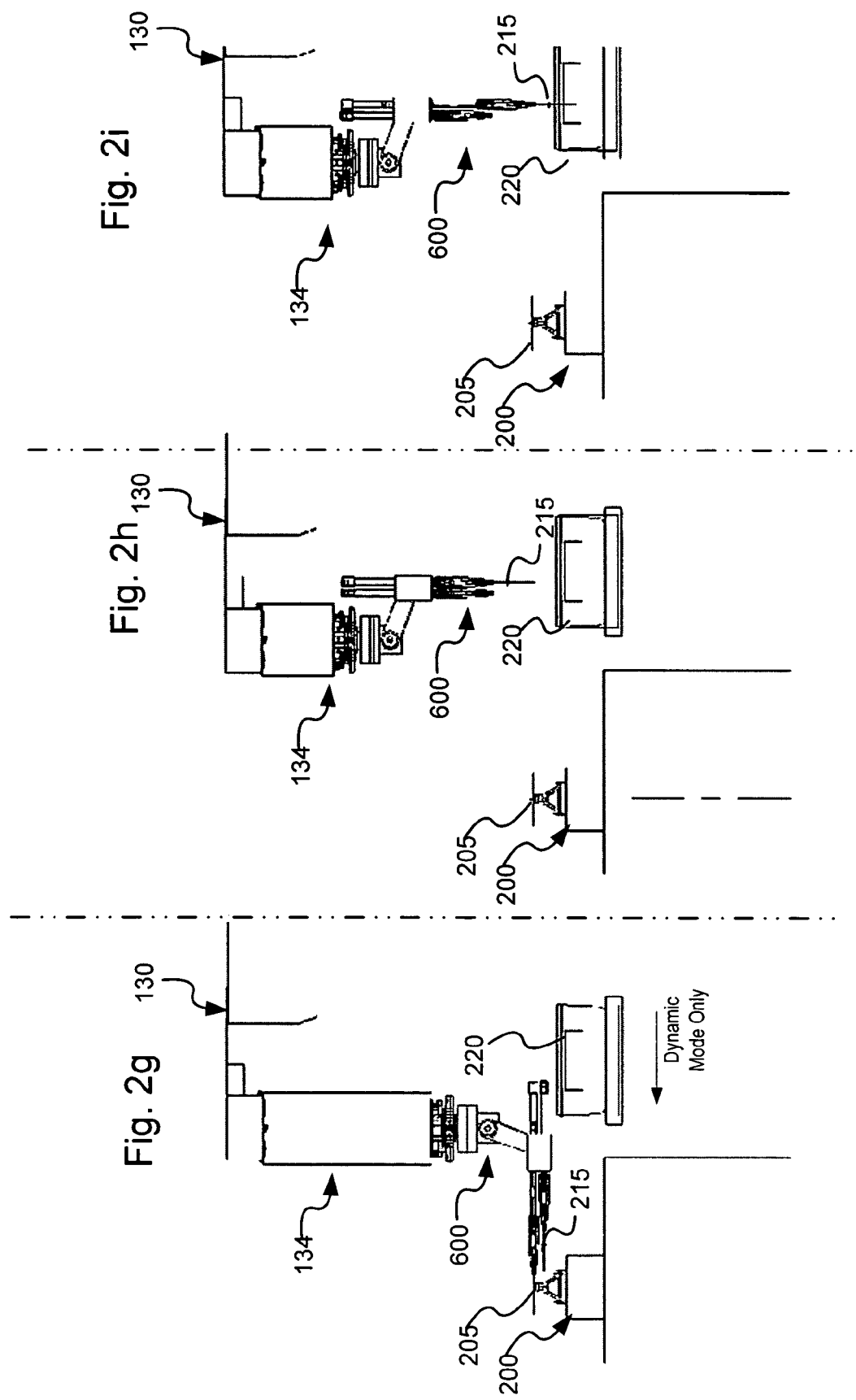

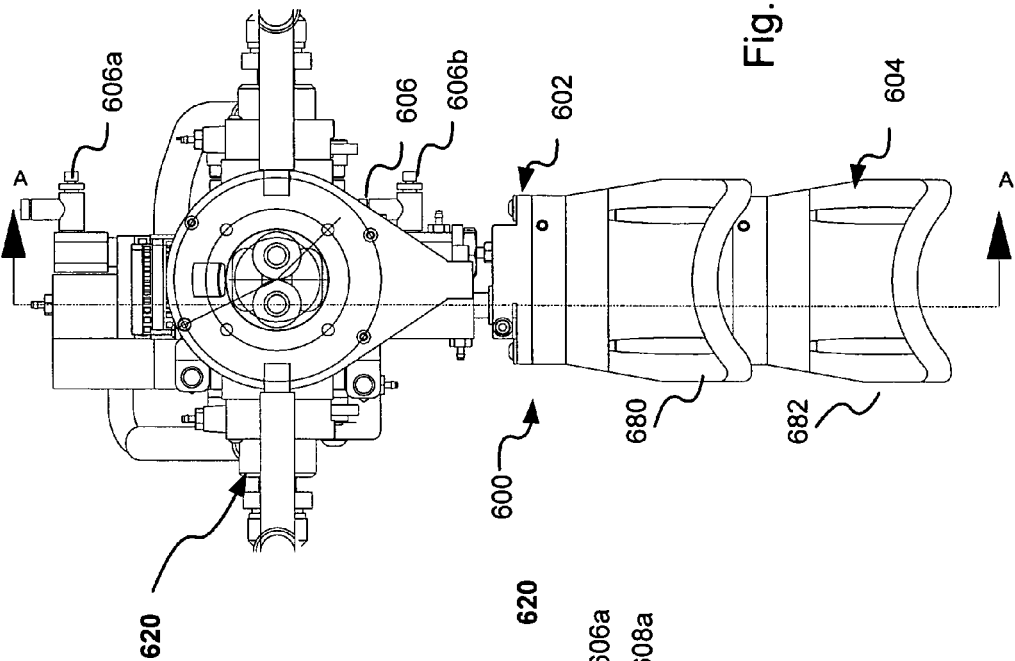
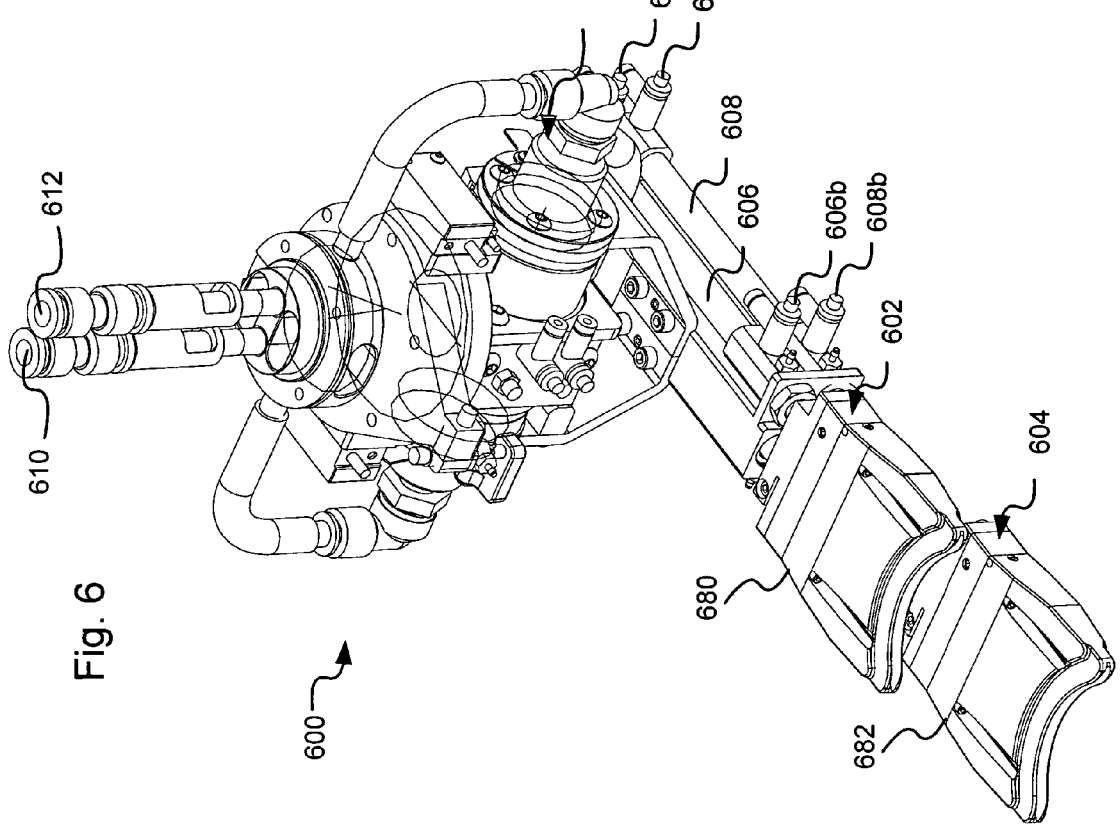

1

DYNAMIC CAROUSEL ROBOTIC WORKCELL

BACKGROUND OF THE INVENTION

1. Field of the Invention

The present invention is directed to a robotic workstation such as those useful in wafer processing.

2. Description of the Related Art

Robotic workstations are applied to numerous industries. In the data storage industry, they have been applied to magnetic disk testing, inspecting and processing. In the storage industry, robotic workstations are centered around a robotic arm operated by a programmable controller which moves disks from a fixture to testing stations placed proximate to the robotic arm. Typically, input disks are provided to a workstation by a human operator in a cassette or carrier and additional empty carriers are used for output disks, finished after the result of testing operations.

In conventional robot-based pick-and-place workcells, input and output is stowed in a specific static location. The robot travels to this location to pick parts and brings them to other machines, processors and/or stations in the work cell that perform some action on the part. Conversely, parts that are complete are retrieved from these stations, brought back to this static location and binned into fixtures for output. This motion contributes to the biggest percentage of the robot's cycle time, which is the metric for the speed and the potential or actual throughout of a robotic work cell.

Each robot includes an end effector which retrieves and settles disks in the fixtures. In the application of testing or processing rigid media such as magnetic disks, conventional workcells have a dual sided end-effector that holds two disks 180° apart. The robot moves to the machine to be serviced, removes the old disk, rotates its end-effector 180°, and brings the new part to the machine. Due to inertial constraints of the hardware, the fastest exchanges possible are around 2.0 to 2.4 seconds. During this time, the rest of machine sits idle. In addition, the 180° rotation requires that a volume of space above the machine be kept clear to avoid collision. This air-space requirement can cause problems when machines are packed tightly together in a workcell, as the robot may have to retreat to a safe location a short distance from the machine to perform the rotation, then go back to bring the new part to the machine. This degrades cycle time.

To combat this problem and improve performance, single sided, dual paddle, end effectors were developed. In general, these single ended end-effectors were attached to the robot's z-shaft at their center of rotation. Each paddle was on a pivot and could pitch down or pitch up, by means of a pneumatically actuated air cylinder. The reason for this pitch up/down requirement is that the cassettes carry the disks vertically while the spindles that test the disks require them to be rotated so that the disk surfaces are parallel to the floor and ceiling.

Generally, robots and end effectors perform a number of standard functions in relation to magnetic disk processing. These functions include first picking a disk from a fixture or cassette, whereby a paddle is pitched down, the robot positions it on top of the disk to be picked and the disk is retrieved into the paddle. Following this, the robot moves up and away from the test station. The robot can also go to a tester that just finished testing a disk. In this task, the robot pitches both paddles up and moves to the tester with the empty paddle. The robot can take the old disk in one paddle, in which case the paddle acquires the old disk and moves up over the spindle. The robot can put a new disk on. In a dual end effector system, to put the new disk on, the robot rotates the end-effector 180°, moves down and drops off the new disk on the spindle. Next, the robot can bin the old disk by moving toward the output cassette, pitching down the paddle with the completed disk, moves down into the slot and releases the disk.

Most of the prior art end-effectors had a somewhat compact body, with pneumatic actuation to pitch the paddles. The smaller the body, the longer the paddle pivot that was need and more vertical-stroke used in moving the end effector up and down to get disks on and off testers and cassettes.

An end effector developed by Phase Metrics Inc., included a slimmed down body making it very thin as compared to the previous versions. Doing this, and keeping the center-of-disk constant as compared to the dual sided, end-effector, resulted in much shorter pivot distances. This, along with the lighter weight and smaller rotational inertia resulted in much faster performance.

The only drawback to this end-effector, as compared to the dual end type, is that even when both paddles are pitched down, the distance is longer than the old end-effector. This requires more space in the workcell for the robot to move around so that it does not collide with various obstacles. These obstacles may be safety enclosures, tester components or the robot itself.

In some workcells, testers are arranged in a circle around the robot, each with its own safety enclosure/shield. When technicians take a testers offline to work on them, the safety shield is raised to protect them from the robot inadvertently attempting to access the space they are occupying. This shield unfortunately consumes some of the robot's work space and interferes with the end-effector when the robot is exchanging disks on an adjacent tester. In this case, the robot must take the old disk, move back to a safe point, pitch down both paddles and then move in to drop off the new part. This motion adds an extra 2.0 seconds to the exchange time.

Because robots and test stations are quite expensive, performance improvements to new and existing robot installations are crucial.

SUMMARY OF THE INVENTION

The present invention, roughly described, pertains to a dynamic workcell. The dynamic workcell includes a three dimensional positioning robot positioned adjacent a plurality of operation stations. A plurality of movable part fixtures located adjacent to the robot is also provided. A fixture location controller directing positioning of the part fixtures relative to the plurality of operation stations to minimize travel between an operation station and a part fixture is provided.

In a further aspect, the invention is a method for operating a workcell including a three dimensional positioning robot and a plurality of movable part fixtures. The method may include the steps of: mapping ones of a plurality of testers to the plurality of movable part fixtures; maintaining the position of each movable part fixture; determining a current location of an active part fixture relative to a mapped tester; and minimizing the distance between the mapped tester and the active part fixture.

In another embodiment, the invention is a method for operating a workcell including a plurality of testing devices. In this embodiment, the method includes the steps of: providing a plurality of movable part fixtures positioned on a rotational carousel surrounding a part selection robot; maintaining the position of each movable part fixture; and upon a command to service one of the plurality of testing devices, moving the carousel to position a work fixture adjacent to said one of said plurality of testing devices.

Where computer instructions are indicated, the present invention can be accomplished using hardware, software, or a combination of both hardware and software. Software used for the present invention is stored on one or more processor readable storage media including hard disk drives, CD-ROMs, DVDs, optical disks, floppy disks, tape drives, RAM, ROM or other suitable storage devices. In alternative embodiments, some or all of the software can be replaced by dedicated hardware including custom integrated circuits, gate arrays, FPGAs, PLDs, and special purpose computers.

These and other objects and advantages of the present invention will appear more clearly from the following description in which the preferred embodiment of the invention has been set forth in conjunction with the drawings.

BRIEF DESCRIPTION OF THE DRAWINGS

FIGS. 2a through 2i are side views illustrating the retrieval and placement of a work item in a a static process utilized by dynamic workcell of the present invention.

FIG. 6 is a perspective view of an end effector formed in accordance with the present invention.

FIG. 7 is a top view of the end effector shown in FIG. 6.

DETAILED DESCRIPTION

In one embodiment, the invention provides an improved robotic workcell using a dynamic carousel and an improved end effector. A dynamic carousel assisted workcell 100 uses a dynamic carousel 130 to rotationally position parts relative to the testing robot, reducing the distance between the robot arm's current position and its destination. This eliminates the need for the robot to continuously travel to a fixed location and provides a dramatic reduction in the distance traveled and cycle times, and an increase in output. In addition, the carousel assisted workcell uses a parallel end-effector that requires no rotation and can exchange disks at or below 1.0 seconds. The improved end-effector requires very little air-space and exchanges are not affected by how tightly packed the machines are in the workcell.

The carousel assisted workcell has applications in many fields, including medical, semiconductor, rigid media and/or food processing. In this specification, the workcell will be described with reference to an current embodiment used in a magnetic disk testing, inspecting and processing. As such, the description of this embodiment uses the terms "disks" (the product or parts), "spindles" (the machines or stations that test, inspect or process the product or part) and "cassettes" (what carries the product or part through the process steps). Such terms are interchangeable with industry specific terms, products, testers and the like, depending on the application of the workcell.

Figure 1:
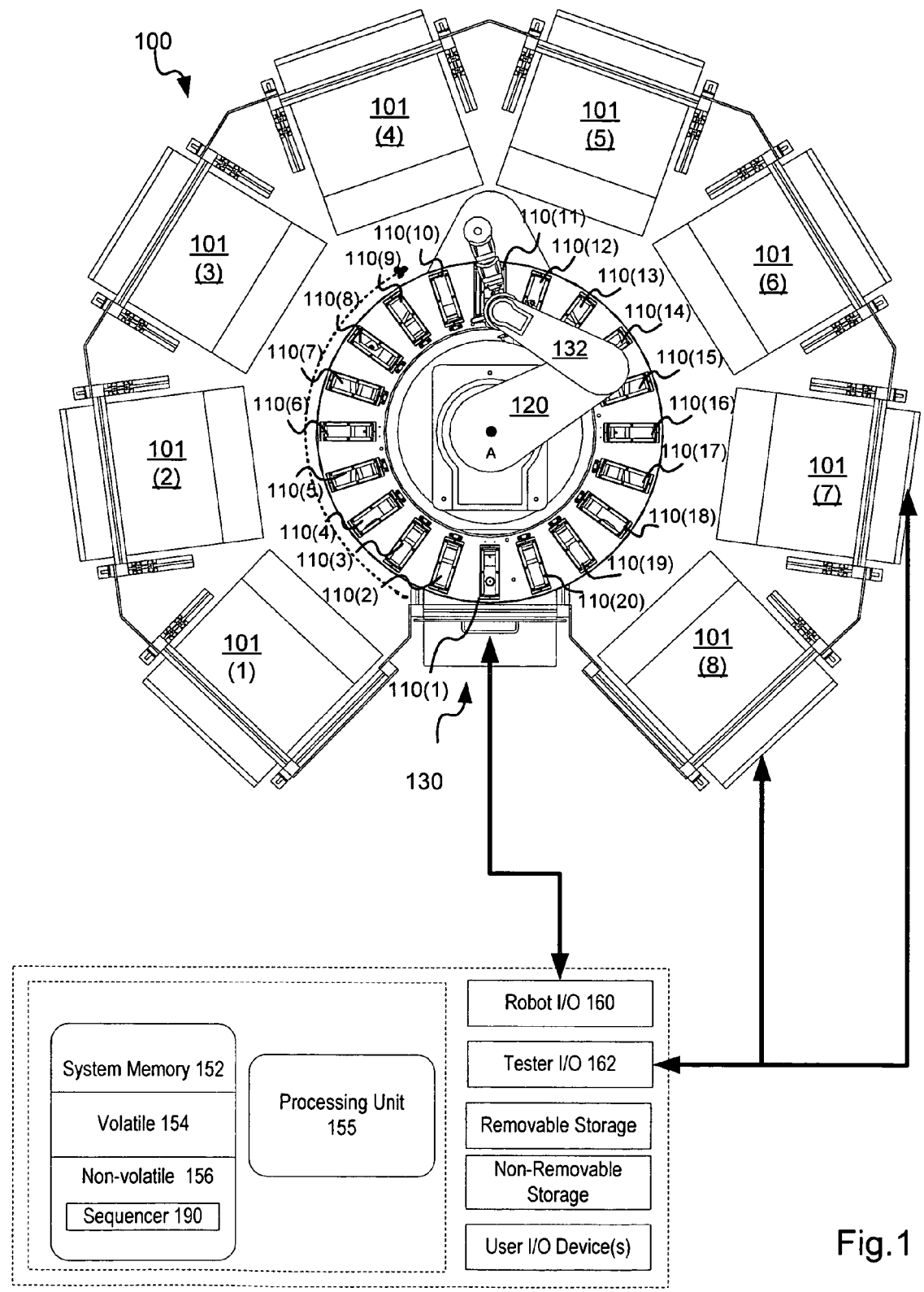
FIG. 1 is a plan top view of a dynamic work cell formed in accordance with the present invention.

FIG. 1 shows a plan view of an exemplary layout of a workcell of the present invention. A Selectively Compliant Articulated Robot Arm (SCARA) robot 120 is positioned inside a dynamic carousel 130 and is surrounded by test stations 101(1)-101(8). SCARA robots generally include a shoulder joint and elbow joint as well as a wrist axis and a vertical motion. SCARA robots are useful for a variety of general purpose applications which require fast, repeatable and articulate point to point movements such as palletizing & de-palletizing, loading and unloading and assembly. Because of their unique "elbow" motions, SCARA robots are also useful for applications which require constant acceleration through circular motions. The SCARA robot 120 includes a standard arm mounting assembly at the end of arm 134 for receiving an end effector, and may be controlled with manufacturer specified instructions in accordance with well known techniques.

The stations 101 can be disk certifiers, optical inspection machines, servo writers or any other machine that performs some action on a part in the manufacturing process, such as disk. A number of fixtures 110 are provided on carousel 130 each fixture 110 is suitable for holding a series of work pieces, such as discs, in a cassette or carrier at such fixture location. In FIG. 1, twenty (20) fixtures 110(1)-110(20) are provided on carousel 130. Each fixture 110(1)-110(20) is in a location identified by the parenthetical number (1-20). It will be understood that while each fixture 110(1)-110(20) moves with the carousel 130, reference to locations 1-20 will be made herein as fixed locations. It will be understood that the particular number of workstations or fixtures may be altered in accordance with the present invention.

A computer processing device 150 is included in the workcell 100 controls carousel 130, robot 120, stations 101. An exemplary system for implementing the processing device 150 includes a processing unit 155 and memory 152. Depending on the exact configuration and type of computing device, memory 152 may be volatile 154 (such as RAM), non-volatile 156 (such as ROM, flash memory, etc.) or some combination of the two. Additionally, device 150 may also have mass storage 166 (removable and/or non-removable) such as magnetic or optical disks or tape. Similarly, device 150 may also have user input and output devices 168 such as a keyboard and pointing device, commonly referred to as a mouse, trackball or touch pad. Other input devices (not shown) may include a microphone, joystick, game pad, touch screen, scanner, or the like. These and other input devices are often connected to the processing unit through a user input interface that is coupled to a system bus, but may be connected by other interface and bus structures and/or output devices such as a display. Other aspects of device may include network connections to other devices, computers, networks, servers, etc. using either wired or wireless media. The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like. All these devices are well known in the art and need not be discussed at length here.

The device 150 may include tester and robot I/O connectors specifically adapted to communicate processing commands to enable the methods described below to the robot 120, carousel 130 and test station 101.

In the context of the invention, methods are performed by the robot and carousel under the control of the processing device. The methods may be implemented by computer executable instructions, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments. The construction of such instructions, and the interface to the robot, carousel and testers, are within the knowledge and ability of one of average skill in the art.

In operation, the workcell of the present invention has at least two operating modes: static mode, where the carousel 130 is fixed; and dynamic mode, where the carousel 130 rotates about axis "A" relative to the robot to position the carousel closer to the testing station.

At the beginning of any operation involving the workcell, disks are loaded in the carriers at the fixtures 101 of carousel 130. A select number of carriers are "input" carriers (loaded with disks), some number are "output"carriers (empty) and one carrier may include calibration media. The locations of each are stored in the system controller 150. Based on the footprint of the product carriers, the carousel can hold n positions. In one implementation of a magnetic disk testing inspecting and processing workcell, the carousel holds up to 20 positions 110(1)-110(20) of 95 mm cassettes or 40 positions of 25 mm cassettes. Each cassette position is assigned a specific function and location: input cassettes or standards cassettes.

Figure 9B:
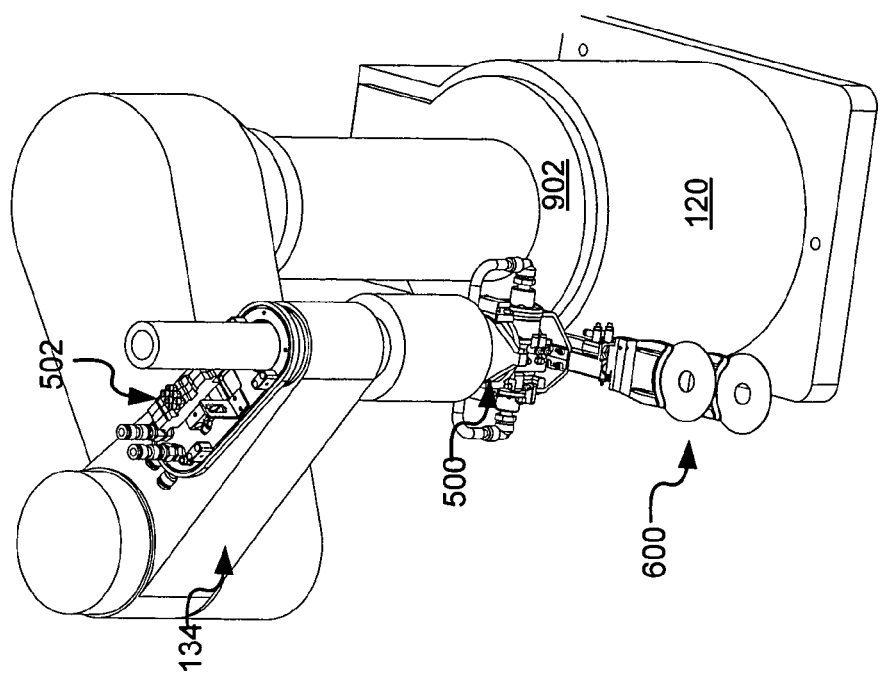
FIG. 9a is a side view and FIG. 9b a perspective view of a robot suitable for use in the present invention.
Figure 9A:
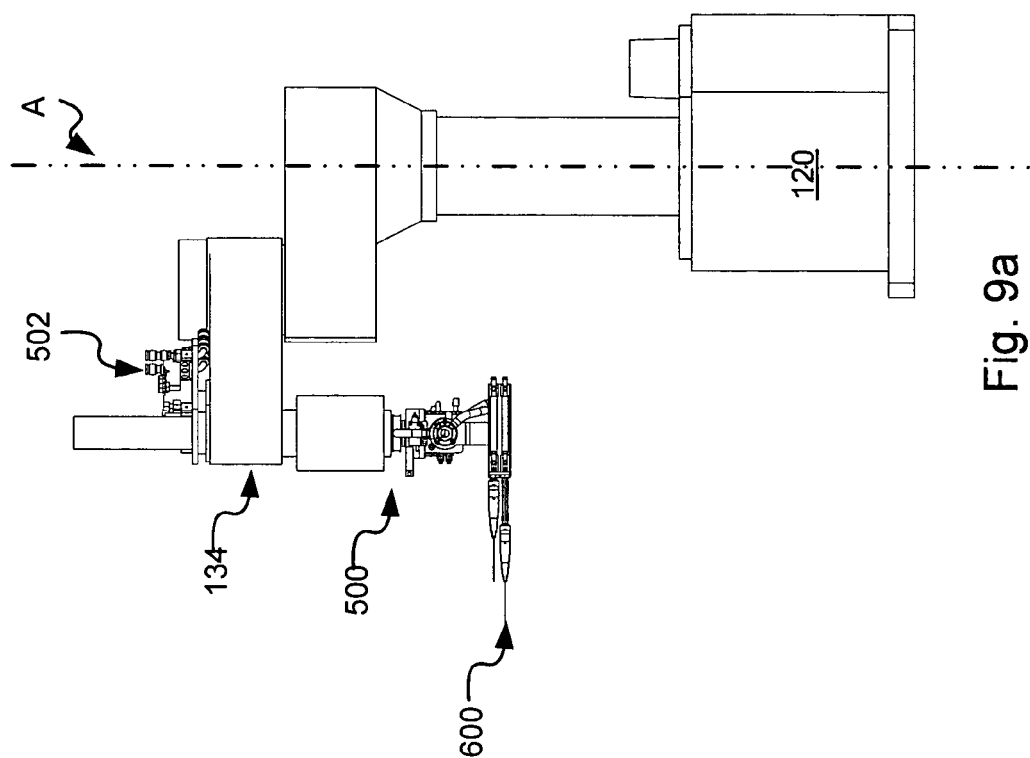

FIGS. 2a-2l shows the sequence of steps the work cells follows in order to pick, exchange and bin disks in, for example, a steady state. As will be described below, FIGS. 2a-2i may also illustrate a dynamic state where the carousel itself is moved between FIGS. 2f to 2g. FIG. 9a is a side view of the full robot and FIG. 9b is a perspective view of the robot. The depictions in FIGS. 2a-2i are partial views of the robot arm.

In general, there are three possible ways that a robot can be sent to service a station. The first is to bring a part to a station 101 that has no completed part(s) on it. This can occur when a station 101 is first brought online and it has no parts on it. The robot picks a part from input carrier, brings it to the station and takes nothing back: it performs a pick-and-exchange. The second is to take away a part from a station 101. One way this can occur is when a station is scheduled to be offline. The current part completed but no more parts are brought to the station. The robot moves to the station, removes the part, declares the station offline, then bins the part; this is sometimes referred to as exchange-and-bin. Finally, the robot can be charged with bringing a part to a station and take the old one away. This is by far the most common occurrence during operation of the workcell. The robot picks a part, moves to the station, takes the old part, gives the station the new part and bins the old part. This is referred to as pick-exchange-and-bin.

FIG. 2a shows the arm 134 of robot 120 hovering over an input cassette 210. Cassette 210 is referred to as an input cassette since in this example it includes input media which has not been sent to a work station 101. Arm 134 includes an end effector 600 rotated vertically with a first paddle 602 and second paddle 604. Each paddle 602, 604 can separately carry a disk or other work item. A further description of the end effector 600 is provided with respect to FIGS. 6-9.

Briefly, each paddle includes a vacuum chamber including a hollowed portion at the end of each paddle, coupled to and then through, the end-effector to a computer controlled vacuum line. Each paddle is connected to air cylinders that move the paddles in and out, and the two paddle/cylinder assemblies to a rotating air cylinder that pivots the end effector up and down. When the end-effector is parallel to the floor and the disk surfaces face the floor and ceiling, as shown in FIG. 2c, it is said to be in a pitch-up position. The end-effector must be in this position to exchange disks at a spindle 200. Rotating the end-effector downward 90°, results in the disk edges pointing toward the floor and ceiling (disk surfaces are now perpendicular to the floor and ceiling). The end-effector is said to be in a pitch-down position. This position allows the robot 120 to pick and bin disks from cassettes/carriers 210. The paddles can be extended or retracted regardless of the pitch-up or pitch-down position of the end-effector. Each air cylinder is controlled by a dual-solenoid. To extend the paddle, a first solenoid is turned on and second solenoid turned off. To retract it, the first solenoid is turned off and the second solenoid is turned on. To make the cylinder go limp, both are turned off.

In FIG. 2a, the robot hovers the end effector 600 over the cassette 210 assigned to the spindle 200 on tester 100 with the end-effector pitched-down and both paddles retracted. (Assignment of testers to cassettes is discussed below.) Spindle 200 includes a disk 215 which has completed testing.

In FIG. 2b, the designated pick paddle, in this case paddle 602, is extended and immediately made limp. As discussed below, this comprises extended, and then ending the actuation of the paddle so that the paddle hangs at the extended position shown in FIG. 2b. Next, the robot 120 moves arm 600 and paddle 602 down as shown in FIG. 2b and vacuum is applied to the head of the paddle 602. This picks up the disk 205 from the cassette 210 and the robot 103 then moves back up as shown in FIG. 2c. In FIG. 2c, the pick paddle 602 is retracted and the robot 120 moved up over the cassette 210.

Figure 2F:
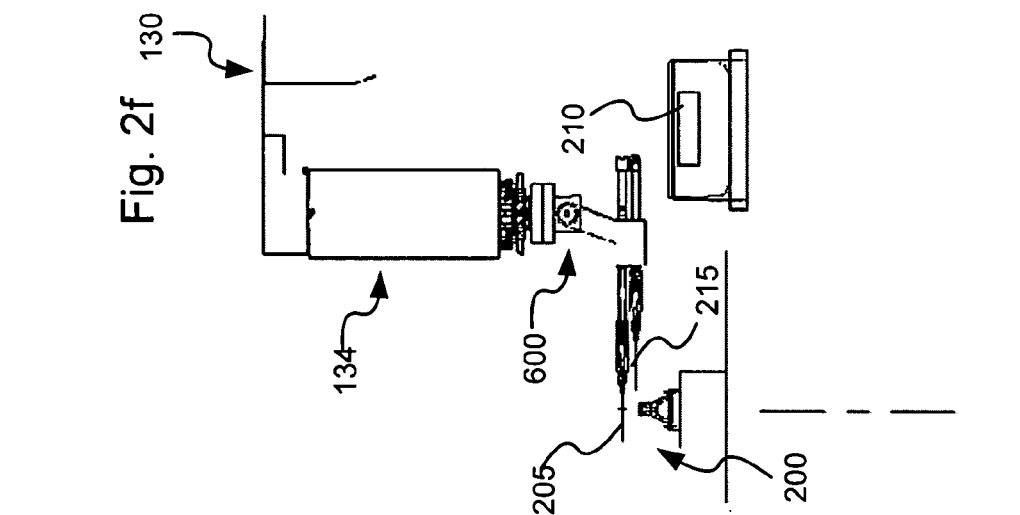
Figure 2E:
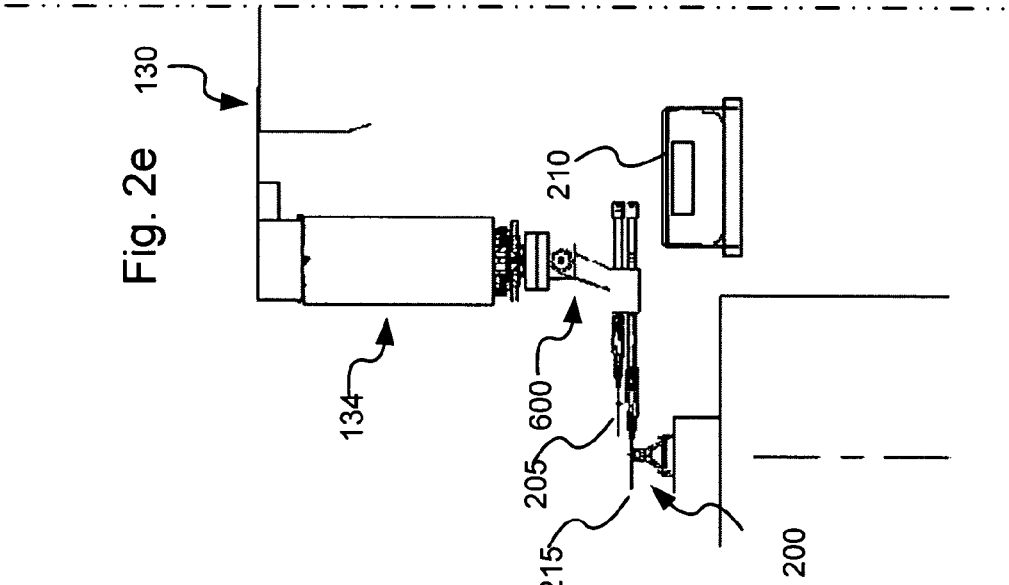
Figure 2D:
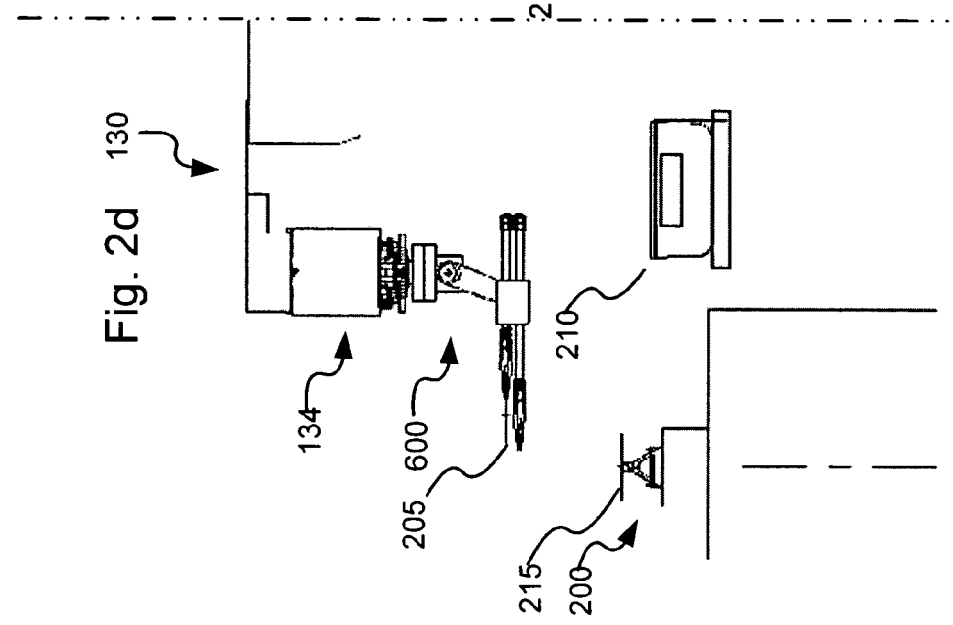

Next the end effector 600 is pitched horizontally for transport and placement of the disk on spindle 200. FIG. 2d shows the end-effector 600 pitched up while the robot 120 makes its move toward the spindle 200. In FIG. 2e, the robot 120 moves end effector 600 down and extends the empty paddle 604, turns on vacuum to paddle 604, then lifts the completed disk 215 above the spindle 200. Next, as shown in FIG. 2f, the paddle 604 holding the completed disk 215 is retracted and, simultaneously, the paddle 602 holding the unprocessed disk is extended over spindle 200. In FIG. 2g, the robot 120 moves down, dropping off the new disk 205 onto the spindle 200, releasing vacuum and retracting the extended (and now empty) paddle 604.

Next, the completed disk 215 is moved to an output cassette 220. In FIG. 2g, an output cassette 220 has replaced the input cassette 210 in the figure. In static operation the output cassette 220 does not change its physical location on the carousel and the carousel is not rotated. Its representation in FIG. 2g while in the same location as previously depicted carrier 210 nevertheless represents a different (static) physical location than that of carrier 210. However, in dynamic operation, output carrier 220 is rotated to a position adjacent to spindle 200, reducing the regressed movement of the robot 120. In FIG. 2h, robot 120 moves to the cassette 220, pitching down the end-effector 600. As shown in FIG. 2i, paddle 604 with the completed disk 215 is extended, vacuum released and the disk 215 successfully binned in carrier 220.

This completes an operational (static or dynamic) cycle and brings the cassette corresponding to the grade of the disk on the spindle. As will be described below, in dynamic operation, the fixture holding the cassette can be moved to position either the input disk cassette or the output cassette closer to the position of the tester to improve performance of the workcell. In the above figures, positioning of the input cassette would take place in advance of FIG. 2a, while positioning of the output cassette would take place at FIG. 2h when the robot moves to output cassette 220. In general, with reference to FIGS. 2f-2g, if the cell is running in dynamic mode (i.e., the user does not have the carousel locked up) the carousel is repositioned to move cassettes 210 and 220 relative to the position of the robot arm 134.

In accordance with the present invention, performance over static operation scenarios wherein the workcell operates in static mode is achieved using a dynamic mode, wherein the robot 120 and carousel 130 cooperate to move parts to and from the testers and cassettes in an improved fashion. When the workcell runs in dynamic mode, a sequencer 190 running in the processing unit 150 issues commands to the robot in an infinite loop in accordance with the methods described in FIGS. 3-5.

Figure 3:
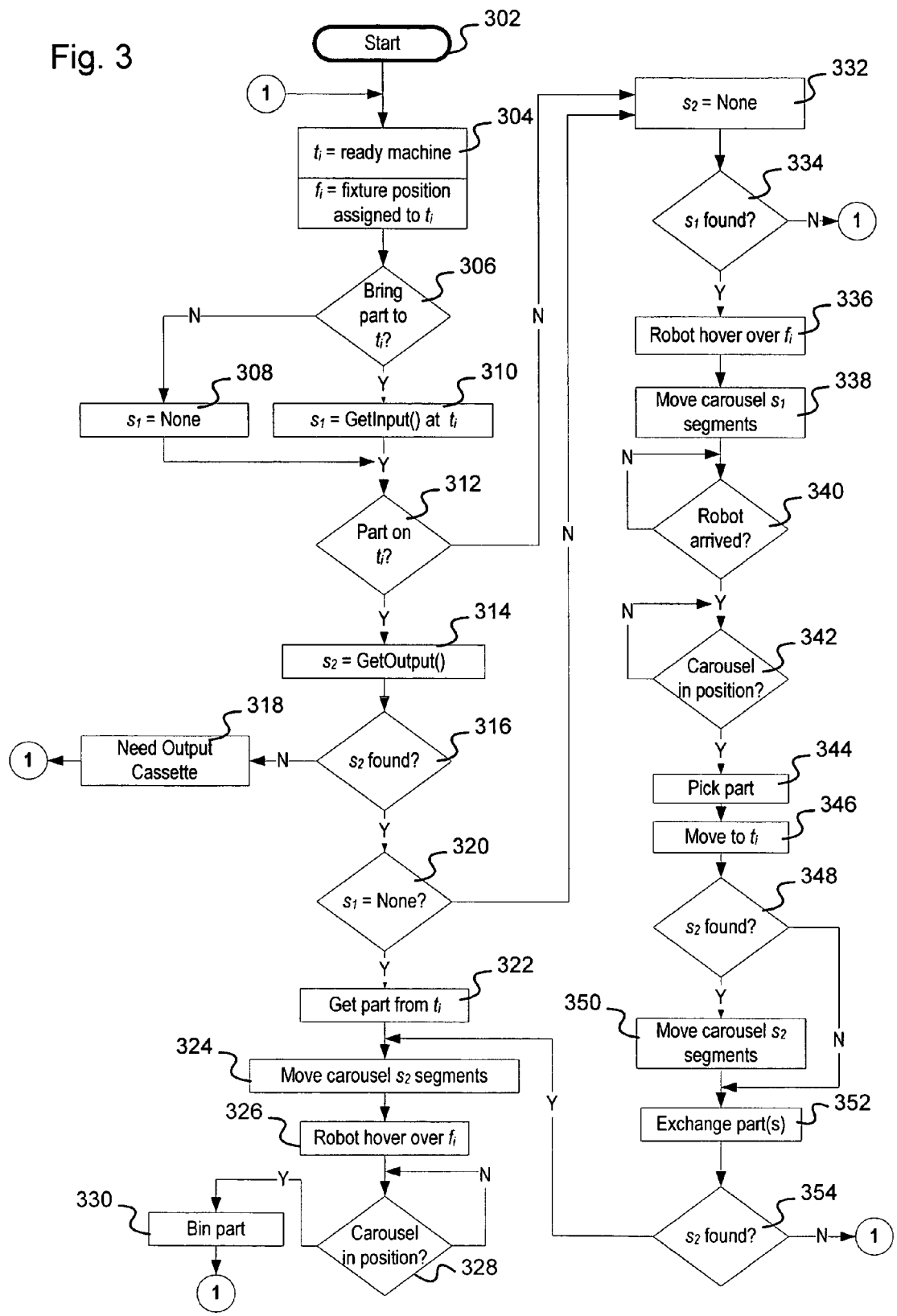
FIG. 3 is a flow chart depicting a method for determining how to position the carousel and robotic arm.

Normally the sequencer 190 issues a series of robotic commands in the order described with respect to FIG. 3. These commands include, but are not limited to, picking, binning, exchanging and or hovering. The robot 120 attempts to perform the requested command, and returns a success/fail code. The sequencer 190 stops as a result of a non-recoverable error or user abort. A combination of the above commands is used to run the workcell.

FIG. 3 is a flowchart of the priority algorithm the sequencer 190 uses determines which station 101(1)-101(8) to service. This can be a station that is just brought online, or one that has completed processing a part. Various methods can be used to resolve which station 101(1)-101(8) should be serviced first.

As the workcell runs in dynamic mode, the carousel must occasionally stop so that completed parts can be replaced with empty carriers and spent inputs can be replaced wit fresh parts. When this occurs, the robot continues to work in static mode. Before moving to the discussion of FIG. 3, it will be noted that in order to control movement of the carousel, the carousel is mapped in a clockwise direction starting from fixture 110(1) to fixture 100(n). These are physical positions that hold parts and/or carriers.

In the example in FIG. 1, the robot may be unable to access certain areas of the workcell. For example, in FIG. 1 the robot cannot access positions 1, 2, 3, 18, 19 or 20 but positions 4 through 17 inclusive are "taught points", that the robot can access. Specific fixture locations are assigned to each station to minimize the distance traveled in dynamic mode. In the example layout of FIG. 1, the following fixture-station mapping is defined:

TABLE 1

| Station | Fixture |
|---|---|
| 101(1) | 110(3) |
| 101(2) | 110(5) |
| 101(3) | 110(7) |
| 101(4) | 110(10) |
| 101(5) | 110(12) |
| 101(6) | 110(14) |
| 101(7) | 110(16) |
| 101(8) | 110(18) |

It should be understood that the foregoing is merely illustrative of a mapping example, and the mapping of stations to fixtures is fully programmable, and can vary based on workcell topology.

The workcell processing device 150 keeps track of every carrier and part in every fixture location in the form of a circular array called a position map. Logical positions are translated to physical positions using this mapping. The position map is n elements long, where n is the number of fixture positions in the carousel. The first element of the position map holds the index of the physical fixture position that corresponds to the logical position at fixture location 1. When the carousel is homed, all physical and logical locations map one-to-one. That is, fixture 101(1) is in position 1, fixture 101(2) in position 2 and so on. If the carousel is indexed (rotated one segment) clockwise, the position map will show fixture n in the $1^{st}$ element and fixture 1 in the $2^{nd}$ element. Using the example in FIG. 1, if the carousel was indexed once clockwise, the $1^{st}$ element in the position map would be 20 and the $2^{nd}$ element would be 1.

Based on the conditions described above, if the station requires a new part, requires a completed part to be taken away or both, the sequencer 190 is programmed with a priority of actions. The sequencer 190 then determines how to position the carousel based on the priority. It does this by using the position map and calculating the minimum number of positions required to rotate the carousel, either in a clockwise or counter-clockwise direction.

Figure 4:
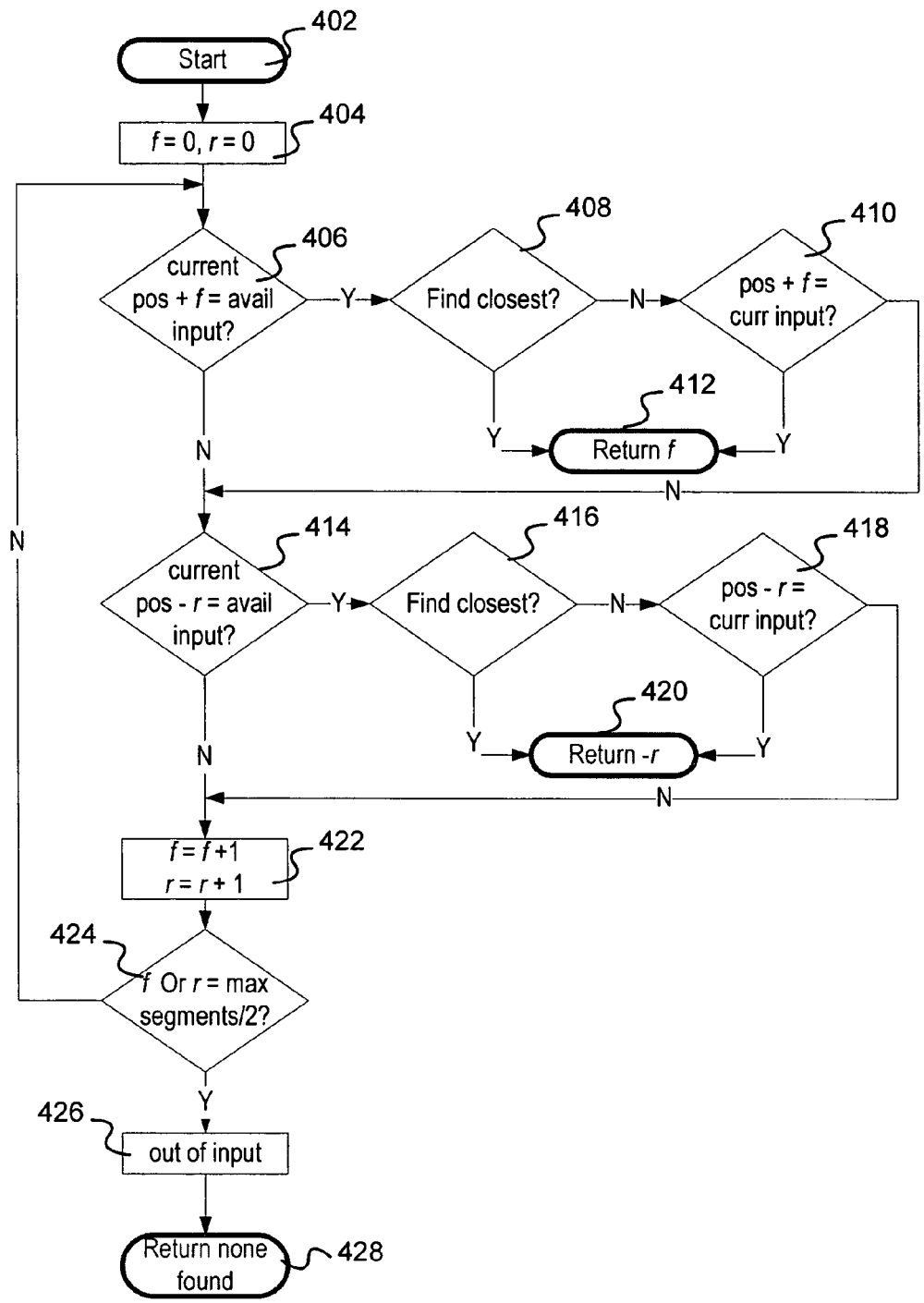
FIG. 4 is a flow chart for a method for determining how to position a carousel when obtaining a part.
Figure 5:
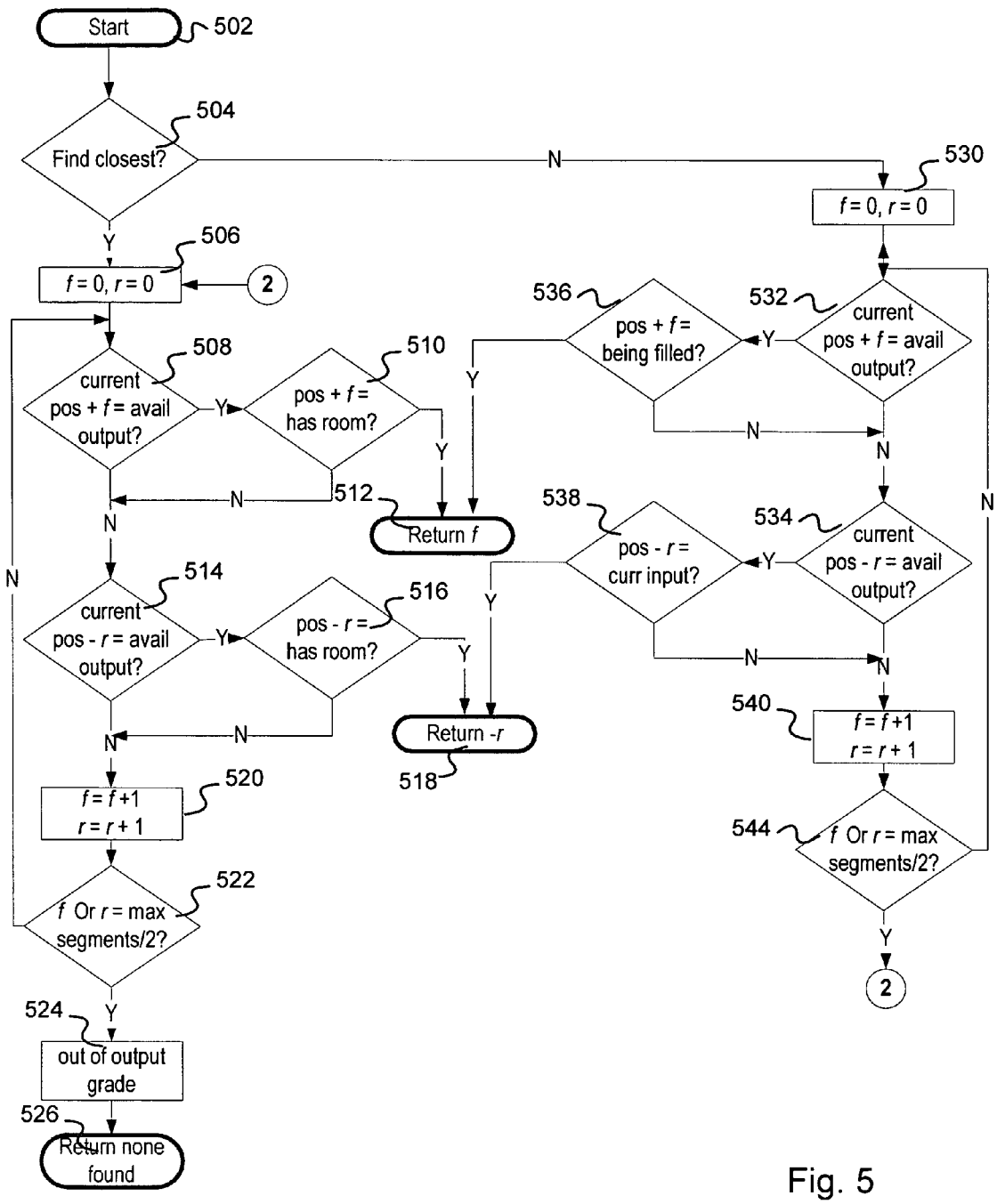
FIG. 5 is a flow chart showing the logic for determining how to position a carousel when binning a part to an output tray.

FIG. 3 shows the logic required to position the carousel after the sequencer has determined which station has the highest priority. In general, the functions that scan the carousel looking for parts (at input positions) or places to store completed/graded parts (at output positions) are shown as GetInput( ) and GetOutput( ), respectively in FIG. 3. These functions may comprise a collection of different functions in the software. FIGS. 4 and 5 show the logic for the GetInput( ) and GetOutput( ) functions, respectively.

In FIG. 3, the abbreviations $T_i$, $F_i$, and $S_i$ are used. $T_i$ indicates a ready station location "i", or tester, such as testers 101(1) through 101(8). The abbreviations $F_i$ indicates the fixture position "i" assigned to the tester position in accordance with the mapping set forth in Table 1. $S_1$ and $S_2$ are the number of segments to the carousel should move in order to position a particular fixture at a position assigned to a tester machine thereby positioning the fixture adjacent to the tester position, minimizing the travel distance for the robot. For example, in FIG. 1, if fixture 110(2) is assigned to tester 101(5), the segment(s) will equal 10 since position 110(2) must be moved 10 segments or 10 rotational positions to position 12 to be adjacent to tester 101(5). Direction is indicated by a plus sign (+) or minus sign (−) relative to the clockwise rotation of the carousel 130.

The method begins at step 304 when, for a ready machine $T_i$, the mapped fixture $F_i$ is determined from Table 1. First decision step 306 determines whether or not to bring a part to the ready machine $T_i$. This determination is based on the user's configuration of the tester. In some cases, the tester may be ready to go off-line or need servicing, and the decisions may result in the answer being no, setting $S_1$=none at step 308. The determination at step 306 is made as a result of settings external to the processing device 150. Hence, as a result of the decision step 306, if no part is to be moved to the particular tester, $S_1$ will equal none.

If a part is to be brought to a tester $T_i$, then at step 310 the GetInput( ) function is performed. The GetInput( ) function is detailed with respect to FIG. 4. The GetInput( ) functions determine the closest available input cassette available. It is possible that no input cassettes will be available and no result will be provided at step 310. This is addressed at step 334 below. GetInput( ) step 310 returns the closest input fixture location relative to the position of the carousel. Next, at step 312, a determination is made as to whether a part is already on the spindle at the tester location, for example spindle 200, of tester $T_i$. If a part is on the spindle, at step 314, the GetOutput( ) process is run at step 314. The GetOutput( )

process determines the nearest available output cassette on accordance with the description below for FIG. 5. Again, it is possible no output cassette will be found, such as in the case where all output cassettes are full and human operator service or an external load/unload mechanism is required to load additional output cassettes into the system.

At step 316, determination is made as to whether or not an output cassette has been found. If no output cassette has been found, this means that no output cassette is available or all output cassettes are full; an alert 318 is provided to the operator to provide a new output cassette into the carousel. If an output cassette is found at step 316, then at step 320, a decision is made to determine whether or not the output cassette is already adjacent to the fixture location of the carousel where the output cassette is located. In this case, the number of positions needed to be moved is none. If no movement is required at step 320, then a part is retrieved from tester $T_i$ at step 322. Next, the carousel is moved the $S_2$ number of segments at step 324, at step 326, the robot hovers over the fixture position assigned to $T_i$. The method checks to ensure that the carousel is in position as determined by step 328, and the part is binned at step 330. As noted below, step 328 is a confirmation step used when other loops of the flow logic reach this point without passing through step 320. This is equivalent the process described above with respect to FIGS. 2g through 2i discussed above.

Returning to decision step 312, if no part is found on tester $T_i$, or, after decision step 320 where $S_1$ is found not to be none, $S_2$ will be set equal to none at step 332. As noted above, decision step 334 determines whether $S_1$ has in fact been found. It is possible that $S_1$ was not returned at step 310. In such case, no input will be available for the tester, and the method returns to start step 302 as indicated by the encircled "1". If $S_1$ has been found at step 334, the robot will be in position hovering over fixture $F_1$ at step 336. The carousel will then be moved $S_1$ segments at step 338. A loop 340/342 determines whether the robot has arrived at step 340, and if the carousel has arrived at step 342. Once both the robot has arrived and the carousel has arrived at step 340 and 342, respectively, a part will be retrieved from the cassette at fixture position $S_1$ at step 344. The robot will then reposition itself to tester position $T_i$ at step 346. Next, determination is made as to whether an output is found. If an output has been found at step 348, the carousel will move $S_2$ segments at step 350, and the parts will be exchanged at step 352. This is equivalent to the movement process described above with respect to FIGS. 2f through 2g.

At step 354, a second determination will be made at to whether or not an output cassette is available at step 354. If no output cassette is available, the method will return to step 302. If an output cassette is available, the carousel will move and finish the loop at step 324, 326, 328, and 330. The loop comprising steps 354, 324, 326, 328, and 330 allows the second part removed from the tester spindle 200 during the exchange step 352 to be removed from the system completely. This would leave the end effector empty of test parts.

FIG. 4 is a flow chart of the GetInput( ) function shown at step 310. In FIG. 4, the abbreviations "f" and "r" are integer variables represented forward and reverse indexes. At step 404, f and r are set equal to zero. At 406, a determination is made to evaluate whether the current position plus f (currently at zero) is an available input. If so, the system checks the "find closest" flag at step 408.

The "find closest" flag is an operator set flag determining whether the system will use a number of parallel input or output cassettes during operation, or proceed to sequentially fill individual cassettes until each cassette is complete (for one or more grades of cassettes). If the find closest flag is off, the system picks parts sequentially from a given input carrier until it is depleted. It then moves on to another available input carrier and proceeds the same way. Similarly when it bins parts to output carriers, it does so by starting with an empty carrier, filling it to its capacity, and then moving on to the next empty cassette. This allows the system of the present invention to work in a manner that current, static work workcells function, allowing for backward compatibility of the system.

To further enhance the throughput of the work cell, the find closest flag can be turned on, causing the work cell to find the closest carrier to the robot or station that can provide an input or an output. In this case, a number of input and output carriers are provided in parallel. Generally, fixture locations are selected so that the input and output cassettes are spaced apart on the carousel, providing a greater probability that a cassette will be a short distance from the tester. As a result, the system will pick from a number of inputs to take from, and outputs to bin the same graded outputs in parallel. The user will see a number of partially used input and output positions in any given time. This results in less movement of the carousel and greater efficiency of the system.

Returning to FIG. 4, at step 408, if the find closest flag is set, the system will return index f at step 412. If the find closest flag is not set, at step 410, determination will be made whether the current position plus the (current) index value at f is a current input for the system (that is, whether or not the current input is the cassette being operated on in accordance with the above discussion).

At step 414, a determination will be made as to whether the current position minus reverse index r is an available input. Initially, both f and r are zero, so initially step 414 is duplicative of step 412. If so, the system will again check the find closest flag at step 416 and if the find closest flag is not set, the decision at step 418 will determine whether or not the position warrants the reverse index as a current input. If neither the steps 410 or 418 result in a current input position, the values of f and r are incremented at step 422.

At step 424, the method determines whether a maximum number of possible positions has been incremented, by determining whether number of maximum segments (20 in FIG. 1) divided by 2, has been reached. If not, the system loops through the afore-mentioned steps again to determine the closest available input. If the number of maximum segments divided by 2 has been reached, the system is out of input. Step 324 calculates an upper limit based on a maximum number of segments. This is maximum number of segments of the carousel divided by 2 (which in FIG. 1 is 20/2=10). At step 428, the system returns "none found." As a result, the GetInput( ) step at 310 and 334 will return negative.

FIG. 5 shows the logical flow of the GetOutput( ) function performed at step 314. At step 504, the find closest flag is checked. If the find closest flag is set, the system will begin with setting the indexes f and r equal to zero at step 506. Next, at step 508, the system determines whether the current position plus a forward index in an available output, and if so, will determine at step 510 whether the position has room. If the position does have room it will return the value of a forward index f. Likewise, if the current index plus the forward index is not an available output, the system will check the reverse indexes at step 514 and 516 and return the current position minus the reverse index at step 518. If neither returns an available output, the indexes will be incremented at step 520, and at step 522, if the maximum segments divided by 2 has not been reached, it will loop back to step 508. If the maximum number of segments divided by 2 has been reached, the system is out of output grade at step 524 and none found is returned at step 526.

If the find closest flag has not been set, the indexes are set at zero at step 530 and at step 532, a determination is made as to whether the current position plus f is an available output at step 532. If so, at step 536, a determination is made as to whether the current carrier position plus the forward index f is checked being filled. If it's not being filled, the method to determine whether the current position minus the reverse index is an available output step 534 and whether it is being filled at step 538. If neither of these loops returns a positive result, the indexes are incremented at step 540 and a determination made at step 544 whether the maximum number of segments divided by 2 has been reached. The loop continues until as "current," the filling cassette is found.

It should be noted that the segment indexes returned may fall into one of the non-accessible locations for the robot. In such case, the carousel is rotated to the closest accessible location for the robot.

It should be further understood that operation of the processing device allows for human operator initiated manual commands to override all or part of the above sequence. For example, one or more test stations or fixture locations may be offline. In such cases, the system can still operate in dynamic mode.

As noted above, in a further unique aspect of the present invention, a unique vacuum operated, dual end effector is utilized to further improve performance of the system of the present invention. The use of vacuum in the paddle heads allows disks in carriers to be "drawn up" into the effector and, by being so drawn, cut off the vacuum suction that draws the disc into the effector. As a result, the end effector never needs to make contact with the media before the media is retrieved into the paddle head. As a result, performance is improved and the potential for physical damage to the disk substantially reduced.

Figure 8:
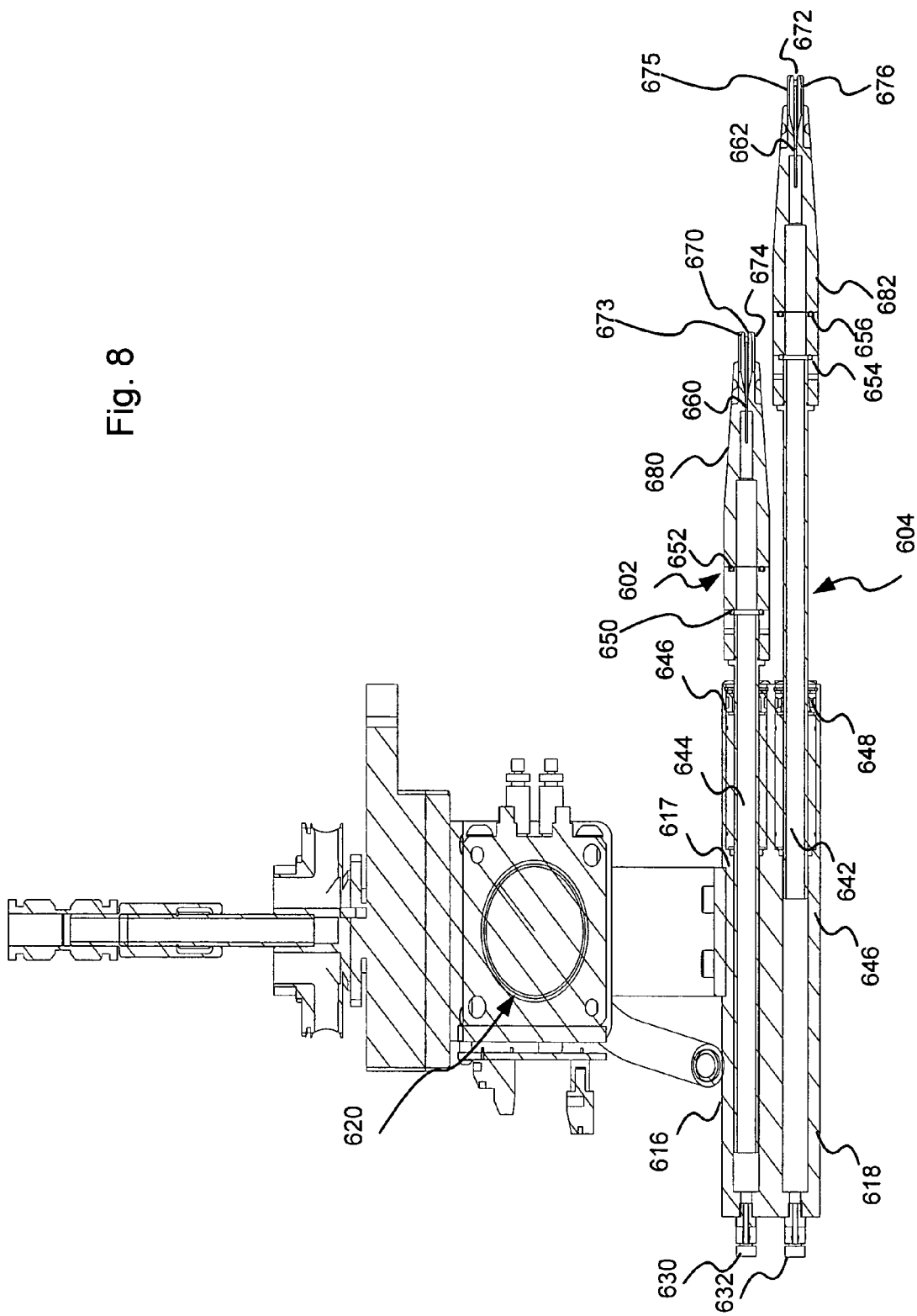
FIG. 8 is a side view along line 8a in FIG. 7 showing a cut-away view of the end effector of the present invention.

FIG. 6 is a perspective view, FIG. 7 a plan view, and FIG. 8 a cut-away view along lines A-A in FIG. 7, of an end effector formed in accordance with the present invention. FIG. 9a is a side view of the full robot and FIG. 9b is a perspective view of the robot. The parallel end effector 600 includes two vacuum paddles 602, 604 that, with suction applied, keep the disks securely in place while the robot 120 is inserting or removing them from cassettes, exchanging them at spindles or traveling around the workcell with them.

End effector 600 includes two paddle assemblies 602, 604 each of which includes a respective paddle head 680, 682, positioning solenoids 606, 608, and vacuum cylinders 616, 618. As noted above, positioning solenoids 606, and 608, allow the end effector assembly 602 and 604 to extend end paddles 680, 682 down toward a cassette, or outward toward a spindle in order to position a task disk on the spindle or in the cassette. In operation, the solenoids 606, 608 are conventionally available dual solenoid devices which are actuated by the air provided to input 606a and 606b or 608a or 608b. It will be noted that applying pressure to input 606a will force the paddle head 680 outward, while providing pressure to input 606b will retract the paddle head 680. Applying pressure to neither will cause the system to go "limp" as described above with respect to FIGS. 2a-2i.

End effector 600 rotates into a vertical position about a rotational axis formed by a rotational cylinder 620 under the control of pneumatic pressure provided by feedlines 610 and 612. The end effector 600 is designed to be mounted in a standard robot arm mounting configuration such as a z-shaft tool interface or equivalent. As shown in FIG. 9a, the mounting interface is at the end of arm 134. Arm 134 may be provided at the end of a base unit 902 of robot 120 and include an end effector control tower including a number of valves and solenoids controlling end effector 600.

Prior art end effectors used as a spring loaded mechanism to acquire disks from the spindle or the cassettes. In accordance with the present invention, vacuum pressure is utilized to retract disks into the pallet head 680, 682. As shown in FIG. 8, each vacuum cylinder 616 and 618 includes an outer housing 617 or 619 within which is provided a hollow, extendable and retractable rod 644, 646, respectively. Each rod 644, 646 include a hollow interior portion 640, 642. Each rod is mounted in housing 617, 619 by bearing 646, 648 at the end of each housing, and sealed to ensure that no pressure escapes from the chamber 640, 642. Likewise, the rods 644, 646 are mounted to the panels 680, 682 and sealed by O ring 652, 650, 656, 654. This provides complete suction to the end portion 670, 672 of each paddle assembly 602, 604. Suction is generated through an airway 660, 662 between fingers 673, 674, and 675, 676 so that suction is generated in cavity 670, 672 to retract disks therein. Each paddle 680, 682 is connected to clean room air cylinders that move the disks in and out.

As such, when the end effector reaches a disk, the end effector need not actually come into contact with the disk to take the disk into the end effector. The suction generated by the end effector vacuum force will pull the disk into chamber 670 or 672. The resulted force is so gentle on the disk, that the end effector of the present invention is much gentler than that of the spring actuated end effector discussed above.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A dynamic workcell for performing one or more operations on a plurality of parts, comprising:
   a three dimensional positioning robot positioned adjacent a plurality of operation stations;
   a plurality of movable part fixtures provided on a positioning mechanism located adjacent to the robot, the position mechanism comprising a carousel such that the part fixtures are positioned in a circular configuration surrounding the robot; and
   a fixture location controller coupled to the positioning mechanism and for each movement of a part, directing movement of the part fixtures relative to the plurality of operation stations to minimize a distance traveled by the part carried by the positioning robot between an operation station and a part fixture.

2. The workcell of claim 1 wherein the operation stations are disk testing stations including a spindle.

3. The workcell of claim 1 wherein the part fixtures includes at least one cassette positioned thereon.

4. The workcell of claim 3 wherein said at least one cassette is an input cassette and the controller moves the input cassette relative to the operation stations.

5. The workcell of claim 3 wherein said at least one cassette is an output cassette and the controller moves the output cassette relative to the operation stations.

6. The workcoell of claim 1 wherein the part fixtures are movable in a clockwise and counter clockwise fashion about the robot.

7. The workcell of claim 1 wherein the robot is a SCARA robot.

8. The workcell of claim 1 wherein each fixture includes a disk carrier.

9. The workcell of claim 1 at least twenty carriers are provided on a rotational carousel.

10. A dynamic workcell performing one or more operations on a plurality of parts, comprising:

a robot of movable part fixtures provided on a positionable turntable, the turntable comprising a carousel such that the part fixtures are positioned in a circular configuration surrounding the robot;

a plurality of fixed operation stations located about the positioning turntable;

the robot comprising a three dimensional positioning robot located adjacent to the plurality of movable part fixtures, the positioning robot transferring ones of the plurality of parts between the operation stations and the fixtures; and a fixture location controller coupled to the positioning turntable and, for each movement of a part, directing movement of the part fixtures in a first or second direction relative to the plurality of operation stations to minimize travel of the positioning robot moving the part between an operation station and a part fixture.

* * * * *

UNITED STATES PATENT AND TRADEMARK OFFICE
CERTIFICATE OF CORRECTION

| | |
|---|---|
| PATENT NO. | : 7,435,046 B2 |
| APPLICATION NO. | : 11/136958 |
| DATED | : October 14, 2008 |
| INVENTOR(S) | : Kiaie et al. |

It is certified that error appears in the above-identified patent and that said Letters Patent is hereby corrected as shown below:

Col. 14, line 1: after "a" should be --robot;--
new paragraph then insert --a plurality--

Signed and Sealed this

Seventeenth Day of March, 2009

JOHN DOLL
*Acting Director of the United States Patent and Trademark Office*